(12) United States Patent
Chang et al.

(10) Patent No.: US 6,462,601 B1
(45) Date of Patent: Oct. 8, 2002

(54) ELECTROSTATIC DISCHARGE PROTECTION CIRCUIT LAYOUT

(75) Inventors: Hung-Yi Chang, Hsinchu (TW); Yi-Hua Chang, Hsinchu Hsien (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 09/898,397

(22) Filed: Jul. 3, 2001

(30) Foreign Application Priority Data

May 11, 2001 (TW) ............................................. 9011233

(51) Int. Cl.[7] ................................................. H03L 5/00
(52) U.S. Cl. ........................ 327/313; 327/310; 327/314; 361/91.1; 361/91.5
(58) Field of Search ................................. 327/310, 313, 327/314; 361/91.1, 91.2, 91.5, 91.7

(56) References Cited

U.S. PATENT DOCUMENTS 5,287,241 A * 2/1994 Puar ............................ 361/111
5,729,419 A * 3/1998 Lien ............................ 399/316
6,130,811 A * 10/2000 Gans et al. .................... 391/56
6,239,958 B1 * 5/2001 Kato et al. ..................... 361/56
6,404,016 B1 * 6/2002 Higuchi et al. ............. 257/348

* cited by examiner

Primary Examiner—Terry D. Cunningham
(74) Attorney, Agent, or Firm—J.C. Patents

(57) ABSTRACT

An ESD protection circuit layout. The ESD protection circuit layout has a first ESD protection device, a second ESD protection device, a first CDM ESD protection device, a second CDM ESD protection device, a first charge flow prevention device, a PMOS transistor, an input resistor, an NMOS transistor, a second charge flow prevention device and a substrate resistor. Charges within an integrated circuit device are discharged through a discharging loop comprising of the first CDM ESD protection device and the second CDM ESD protection device. Ultimately, the integrated circuit device is protected against CDM ESD and electrical latch-up within the integrated circuit is also minimized.

12 Claims, 5 Drawing Sheets

US 6,462,601 B1

ELECTROSTATIC DISCHARGE PROTECTION CIRCUIT LAYOUT

BACKGROUND OF THE INVENTION

1. Field of Invention

The present invention relates to an integrated circuit layout. More particularly, the present invention relates to an integrated circuit layout having a protection circuit loop for protecting integrated circuit devices against electrostatic discharge.

2. Description of Related Art

In the fabrication of an integrated circuit (IC) such as a dynamic random access memory (DRAM) or static random access memory (SRAM), or after the fabrication of a silicon chip, electrostatic discharge (ESD) is one of the major causes of damage leading to integrated circuit failure. For example, anyone walking on a carpeted floor in an environment having a high relative humidity (RH) may generate a few hundred to a few thousand static volts in a human body. If the relative humidity is low, a static voltage of up to ten thousand volts or more may be produced in a human body (in the what is called human-body model (HBM) ESD). Machines for packaging integrated circuits or equipment for testing integrated circuits may also generate anywhere from a few hundred to a few thousand static volts depending on climate and humidity (in the what is called machine model ESD). Similarly, the substrate layer of a semiconductor chip may store up large quantities of electric charges capable of an electrostatic discharge (in the what is called charge-device model (CMD) ESD).

When one of these charged bodies contacts a silicon chip, charges may transfer to the chip in a sudden flow, leading to possible damages to internal circuits and devices. To prevent damages to integrated circuit due to ESD, various types of ESD protection methods are developed. One commonly used method is to build ESD protection hardware devices. In short, an on-chip ESD protection circuit is inserted between the internal circuit and each bonding pad.

FIG. 1 is the layout of a conventional ESD protection circuit. As shown in FIG. 1, an electrostatic discharge (ESD) protection device 10 is inserted between a voltage source VCC1 and a bonding pad 14. Another ESD protection device 12 is inserted between a ground terminal GND1 and the bonding pad 14. The source terminal of a PMOS transistor 16 is connected to a voltage source VCC2. The substrate terminal and the source terminal of the PMOS transistor 16 are connected together. An input resistor Rin 20 is inserted between the gate terminal of the PMOS transistor 16 and the bonding pad 14. The drain terminal of an NMOS transistor 18 is connected to the drain terminal of the PMOS transistor 16. The gate terminal of the NMOS transistor 18 is connected to the gate terminal of the PMOS transistor 16. The substrate terminal and the source terminal of the NMOS transistor 18 are connected together. The substrate resistor Rsub 22 is inserted between another ground terminal GND2 and the ground terminal GND1.

The substrate resistor Rsub 22 is an equivalent resistor between the ground terminal GND1 and the ground terminal GND2. The ESD protection device 10 and the ESD protection device 12 together constitute a group of protection circuits protecting the integrated circuit devices against any HBM ESD or MM ESD at the bonding pad 14.

In FIG. 1, when a CDM ESD of the integrated circuit device occurs, there are two major pathways for releasing electric charges within the substrate to the bonding pad 14. A first pathway I1 starts out at the ground terminal GND2 and travels via the NMOS transistor 18 and the input resistor Rin 20 to the bonding pad 14. A second pathway I2 starts out at the ground terminal GND2 and travels via the substrate resistor Rsub 22 and the ESD protection device to the bonding pad 14. If a large quantity of substrate charges flows via the pathway I1 to the bonding pad 14, the current passes through the gate oxide layer inside the NMOS transistor 18. Thus, the gate oxide layer of the NMOS transistor 18 is likely to be damaged in a CDM ESD.

SUMMARY OF THE INVENTION

Accordingly, one object of the present invention is to provide an electrostatic discharge (ESD) protection circuit layout having an additional charge-device model (CDM) ESD protection device within an integrated circuit device so that the integrated circuit device is protected from a CDM ESD.

To achieve these and other advantages and in accordance with the purpose of the invention, as embodied and broadly described herein, the invention provides an electrostatic discharge (ESD) protection circuit layout. The ESD protection circuit layout includes a first ESD protection device, a second ESD protection device, a first CDM ESD protection device, a second CDM ESD protection device, a first charge flow prevention device, a PMOS transistor, an input resistor, an NMOS transistor, a second charge flow prevention device and a substrate resistor. The first ESD protection device is connected to a first voltage source and a bonding pad. The second ESD protection device is connected to a first ground terminal and the bonding pad. The first CDM ESD is connected to a second voltage source and the bonding pad. The second CDM ESD is connected to a second ground terminal and the bonding pad. The first charge flow prevention device is connected to the second voltage source. The source terminal of the PMOS transistor is connected to the first charge flow prevention device. The substrate terminal and the source terminal of the PMOS transistor are connected together. The input resistor is connected to the gate terminal of the PMOS transistor and the bonding pad. The drain terminal of the NMOS transistor is connected to the drain terminal of the PMOS transistor. The gate terminal of the NMOS transistor is connected to the gate terminal of the PMOS transistor. The substrate terminal and the source terminal of the NMOS transistor are connected together. The second charge flow prevention device is connected to the source terminal of the NMOS transistor and a second ground terminal. The substrate resistor is connected to the first ground terminal and the second ground terminal.

The first charge flow prevention device prevents any abnormal charge current from flowing from the second voltage source through the gate oxide layer of the PMOS transistor and damaging the PMOS transistor. The first CDM ESD protection circuit provides a discharging loop so that any abnormal charge current from the second voltage source flows via the first CDM ESD protection device to the bonding pad. Similarly, the second charge flow prevention device prevents any abnormal charge current flowing from the substrate of the integrated circuit device through the gate oxide layer of the NMOS transistor and damaging the NMOS transistor. The second CDM ESD protection circuit provides a discharging loop so that any abnormal charge current from the substrate of the integrated circuit device flows via the second CDM ESD protection device to the bonding pad. The first CDM ESD protection device and the second CDM ESD protection device within the integrated circuit device are normally positioned far away from other internal NMOS and PMOS transistors to reduce possible electrical latch-up.

This invention also provides an alternative electrostatic discharge (ESD) protection circuit layout. The ESD protection circuit layout includes a first ESD protection device, a second ESD protection device, a CDM ESD protection device, a PMOS transistor, an input resistor, an NMOS transistor, a charge flow prevention device and a substrate resistor. The first ESD protection device is connected to a first voltage source and a bonding pad. The second ESD protection device is connected to a first ground terminal and the bonding pad. The CDM ESD is connected to a second ground terminal and the bonding pad. The source terminal of the PMOS transistor is connected to a second voltage source. The substrate terminal and the source terminal of the PMOS transistor are connected together. The input resistor is connected to the gate terminal of the PMOS transistor and the bonding pad. The drain terminal of the NMOS transistor is connected to the drain terminal of the PMOS transistor. The gate terminal of the NMOS transistor is connected to the gate terminal of the PMOS transistor. The substrate terminal and the source terminal of the NMOS transistor are connected together. The charge flow prevention device is connected to the source terminal of the NMOS transistor and the second ground terminal. The substrate resistor is connected to the first ground terminal and the second ground terminal.

The charge flow prevention device prevents any abnormal charge current from flowing from the substrate of the integrated circuit device through the gate oxide layer of the NMOS transistor and damaging the NMOS transistor. The CDM ESD protection circuit provides a discharging loop so that any abnormal charge current from the substrate of the integrated circuit device flows via the CDM ESD protection device to the bonding pad. Such a layout of the CDM ESD protection device within the integrated circuit device is capable of reducing electrical latch-up.

In brief, this invention provides an ESD protection circuit layout. The integrated circuit device includes an additional CDM ESD protection device so that most charges within the integrated circuit device are channeled away via the CDM ESD protection device and ESD protection device. Furthermore, the particular layout of the CDM ESD protection device within the integrated circuit device is capable of reducing electrical latch-up considerably.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
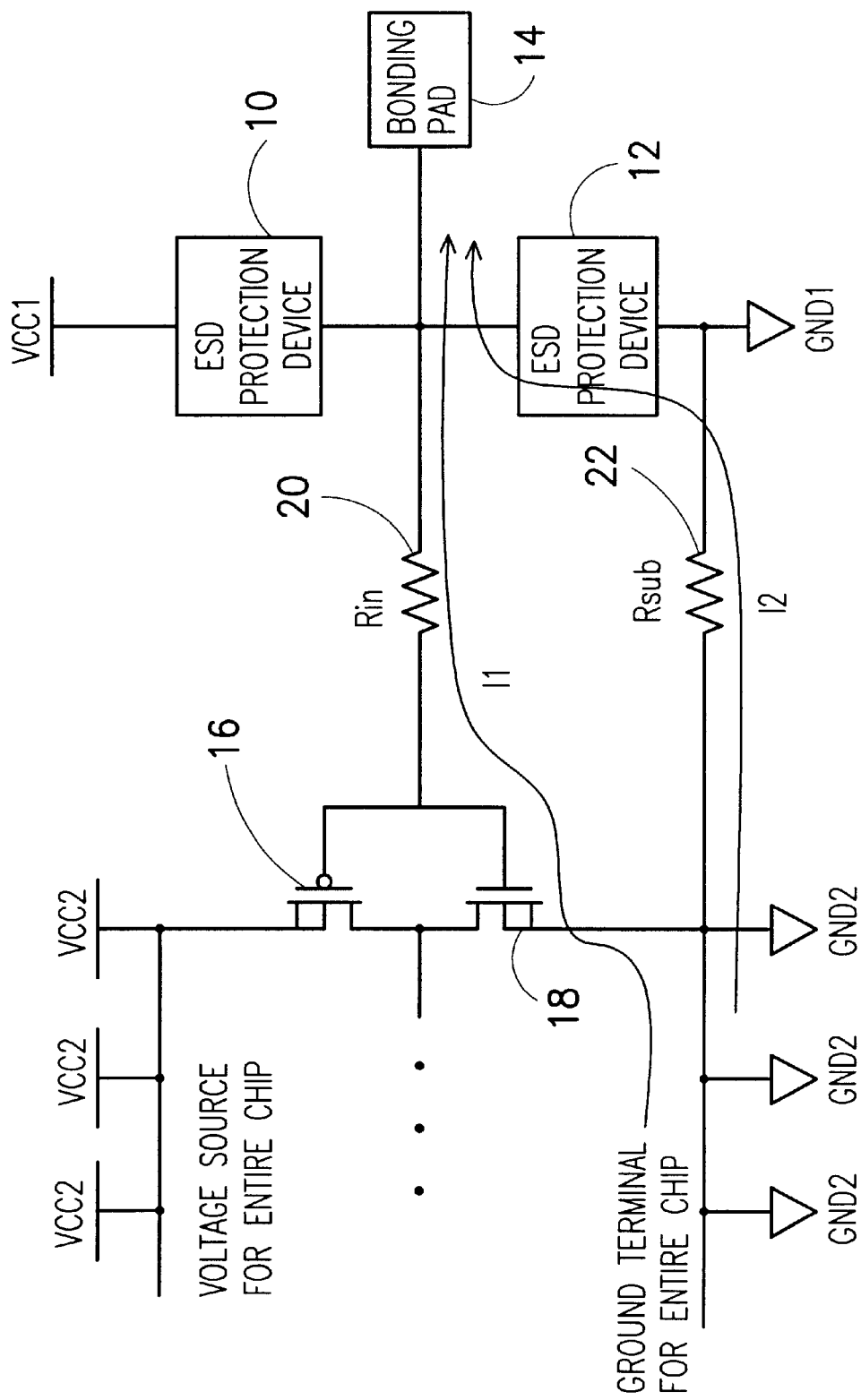
FIG. 1 is the layout of a conventional ESD protection circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
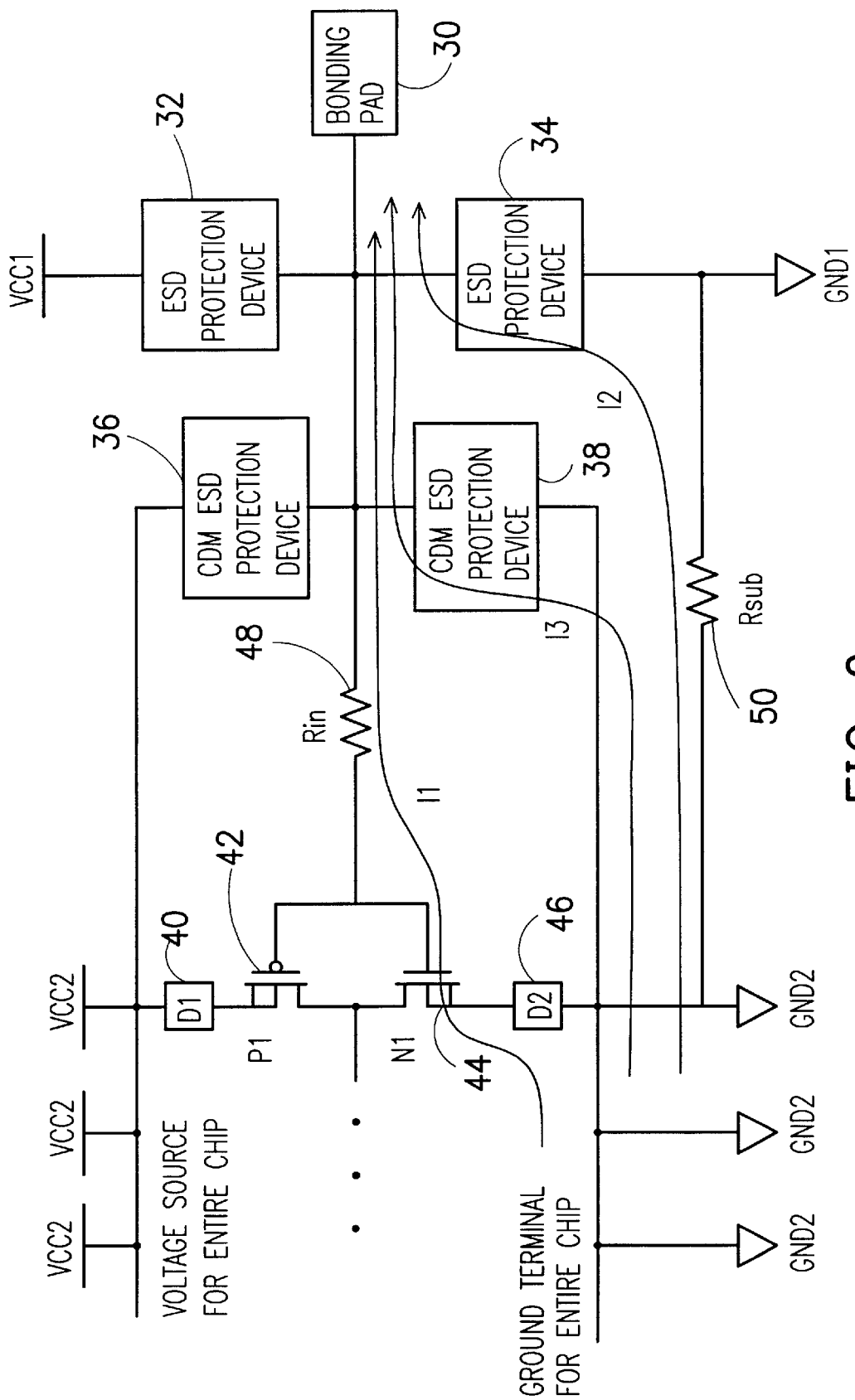
FIG. 2 is a block diagram showing an electrostatic discharge protection circuit layout according to this invention.

FIG. 2 is a block diagram showing an electrostatic discharge (ESD) protection circuit layout according to this invention. As shown in FIG. 2, the ESD circuit includes a first ESD protection device 32, a second ESD protection device 34, a first charge-device model (CDM) ESD protection device 36, a second CDM ESD protection device 38, a first charge flow prevention device D1 40, a first PMOS transistor P1 42, an NMOS transistor N1 44, a second charge flow prevention device D2 46, an input resistor Rin 48 and a substrate resistor Rsub 50. The first ESD protection device 32 is connected to a voltage source VCC1 and a bonding pad 30. The second ESD protection device 34 is connected to a ground terminal GND1 and the bonding pad 30. The first CDM ESD protection device 36 is connected to a voltage source VCC2 and the bonding pad 30. The second CDM ESD protection device 38 is connected to a ground terminal GND2 and the bonding pad 30. The first charge flow prevention device 40 is connected to the voltage source VCC2. The source terminal of the PMOS transistor 42 is connected to the first charge flow prevention device 40. The substrate terminal and the source terminal of the PMOS transistor 42 are connected together. The input resistor Rin 48 is connected to the gate terminal of the PMOS transistor 42 and the bonding pad 30. The drain terminal of the NMOS transistor 44 is connected to the drain terminal of the PMOS transistor 42. The gate terminal of the NMOS transistor 44 is connected to the gate terminal of the PMOS transistor 42. The substrate terminal and the source terminal of the NMOS transistor 44 are connected together. The second charge flow prevention device 42 is connected to the source terminal of the NMOS transistor 44 and the ground terminal GND2. The substrate resistor Rsub 50 is connected to the ground terminal GND1 and the ground terminal GND2. The substrate resistor Rsub 50 is an equivalent resistor of the substrate between the ground terminal GND1 and the ground terminal GND2.

As shown in FIG. 2, when a CDM ESD of the integrated circuit device occurs, there are three basic pathways for releasing the charges within the substrate to the bonding pad 30. A first pathway starts out at the ground terminal GND2 via the second charge flow prevention device 46, the NMOS transistor 44 and the input resistor Rin 48 to arrive at the bonding pad 30. A second pathway starts out at the ground terminal GND2 via the substrate resistor Rsub 50 and the second ESD protection device 34 to arrive at the bonding pad 30. A third pathway starts out at the ground terminal GND2 via the second CDM ESD protection device 38 to arrive at the bonding pad 30.

The second charge flow prevention device 46 prevents any abnormal charge current from flowing from the substrate of the integrated circuit device through the gate oxide layer (along pathway I1) of the NMOS transistor 44 and damaging the NMOS transistor 44. The second CDM ESD protection device 38 provides a discharging loop (via pathway I3 because pathway I2 has the substrate resistor Rsub 50 and hence conduction speed of the CDM ESD protection device 38 is faster than the second CDM ESD protection device 34). Hence, any abnormal charge current from the substrate of the integrated circuit device is channeled to the bonding pad 30 via the second CDM ESD protection device 38 and the second ESD protection device 34. Similarly, the first charge flow prevention device 40 prevents any abnormal charge current from flowing from the voltage source VCC2 through the gate oxide layer of the PMOS transistor 42 and damaging the PMOS transistor 42. The first CDM ESD protection device 36 provides a discharging loop. Hence, any abnormal charge current from the voltage source VCC2 is channeled to the bonding pad 30 via the first CDM ESD protection device 36. Such a layout of the first CDM ESD protection device 36 and the second CDM ESD protection device 38 within the integrated circuit device is capable of reducing electrical latch-up.

Figure 3:
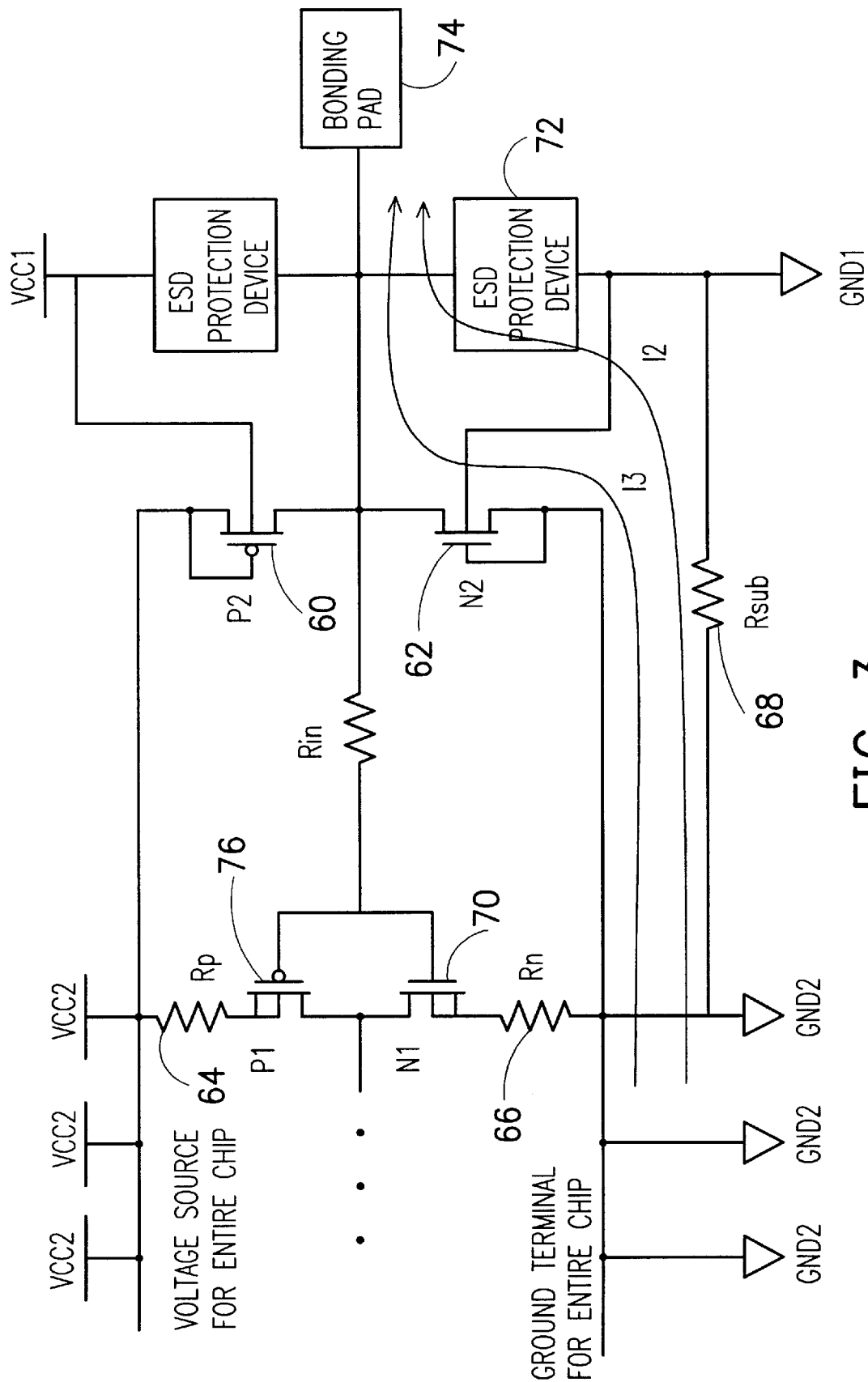
FIG. 3 is an electrostatic discharge protection circuit layout according to the one shown in FIG. 2 but with some blocks replaced by some actual devices.

FIG. 3 is an electrostatic discharge protection circuit layout according to the one shown in FIG. 2 but with some blocks replaced by some actual devices. As shown in FIG. 3, a PMOS transistor P2 60 replaces the first CDM ESD protection device 36 in FIG. 2, an NMOS transistor N2 62 replaces the second CDM ESD protection device 38 in FIG. 2, a resistor Rp 64 replaces the first charge flow prevention device D1 40 in FIG. 2 and the resistor Rn 66 replaces the second charge flow prevention device D2 46 in FIG. 2.

When a CDM ESD of the integrated circuit device occurs, charges are channeled from the substrate to a bonding pad 74 via pathways I2 and I3. Pathway I2 starts out from a ground terminal GND2 via a substrate resistor Rsub 68 and an ESD protection device 72 to arrive at the bonding pad 74. Pathway I3 starts out from the ground terminal GND2 via an NMOS transistor N1 70 to arrive at the bonding pad 74.

The resistor Rn 66 prevents any abnormal charge current from flowing from the substrate of the integrated circuit device through the gate oxide layer of the NMOS transistor 70 and damaging the NMOS transistor 70. The NMOS transistor 62 provides a discharging loop (pathway I3 because pathway I2 has the substrate resistor Rsub 68 and hence the NMOS transistor 62 has a faster conduction speed than the ESD protection device 72). Hence, the abnormal charge current from the substrate of the integrated circuit device is channeled to the bonding pad 74 via the NMOS transistor 62 and the second ESD protection device 72. Similarly, the resistor Rp 64 prevents the flow of any abnormal charge current from the voltage source VCC2 through the gate oxide layer of a PMOS transistor P1 76 and damages the PMOS transistor 76. A PMOS transistor P2 60 provides a discharging loop. Hence, the abnormal charge current from the voltage source VCC1 is channeled to the bonding pad 74 via the PMOS transistor 60.

Figure 4:
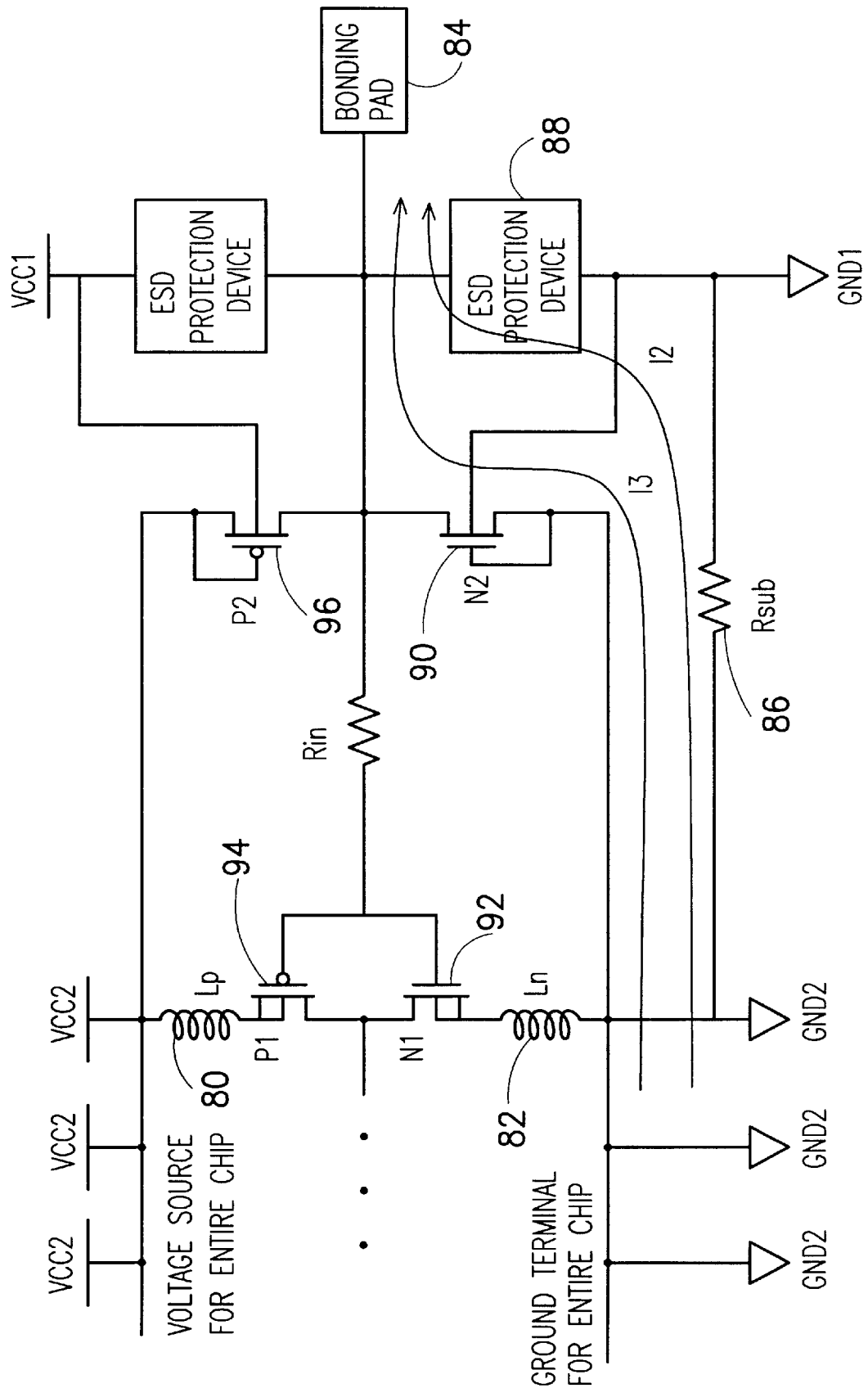
FIG. 4 is an electrostatic discharge protection circuit layout according to the one shown in FIG. 2 but with some blocks replaced by alternative actual devices.

FIG. 4 is an electrostatic discharge protection circuit layout according to the one shown in FIG. 2 but with some blocks replaced by some alternative actual devices. As shown in FIG. 4, an inductance Lp 80 replaces the resistor Rp 64 in FIG. 3 and another inductance Ln 82 replaces the resistor Rn 66 in FIG. 3.

When a CDM ESD of the integrated circuit device occurs, charges are channeled from the substrate to a bonding pad 84 via pathways I2 and I3. Pathway I2 starts out from a ground terminal GND2 via a substrate resistor Rsub 86 and an ESD protection device 88 to arrive at the bonding pad 74. Pathway I3 starts out from the ground terminal GND2 via an NMOS transistor N2 90 to arrive at the bonding pad 84.

The inductor Ln 82 prevents any abnormal charge current from flowing from the substrate of the integrated circuit device through the gate oxide layer of an NMOS transistor N1 92 and damaging the NMOS transistor 92. The NMOS transistor 90 provides a discharging loop (pathway I3 because pathway I2 has the substrate resistor Rsub 86 and hence the NMOS 90 has a faster conduction speed than the ESD protection device 88). Hence, the abnormal charge current from the substrate of the integrated circuit device is channeled to the bonding pad 84 via the NMOS transistor 90 and the second ESD protection device 88. Similarly, the inductor Lp 80 prevents any abnormal charge current from flowing from the voltage source VCC1 through the gate oxide layer of a PMOS transistor P1 94 and damaging the PMOS transistor 94. A PMOS transistor P2 96 provides a discharging loop. Hence, the abnormal charge current from the voltage source VCC1 is channeled to the bonding pad 84 via the PMOS transistor 96.

In FIG. 2, resistors (for example, resistors Rp 64 and Rn 66 in FIG. 3) or inductors (for example, inductor Lp 94 and Ln 92) are used in place of the first charge flow prevention device D1 40 and the second charge flow prevention device D2 46. However, metal-oxide-semiconductor field effect transistors (MOSFETs) can also be used.

Figure 5:
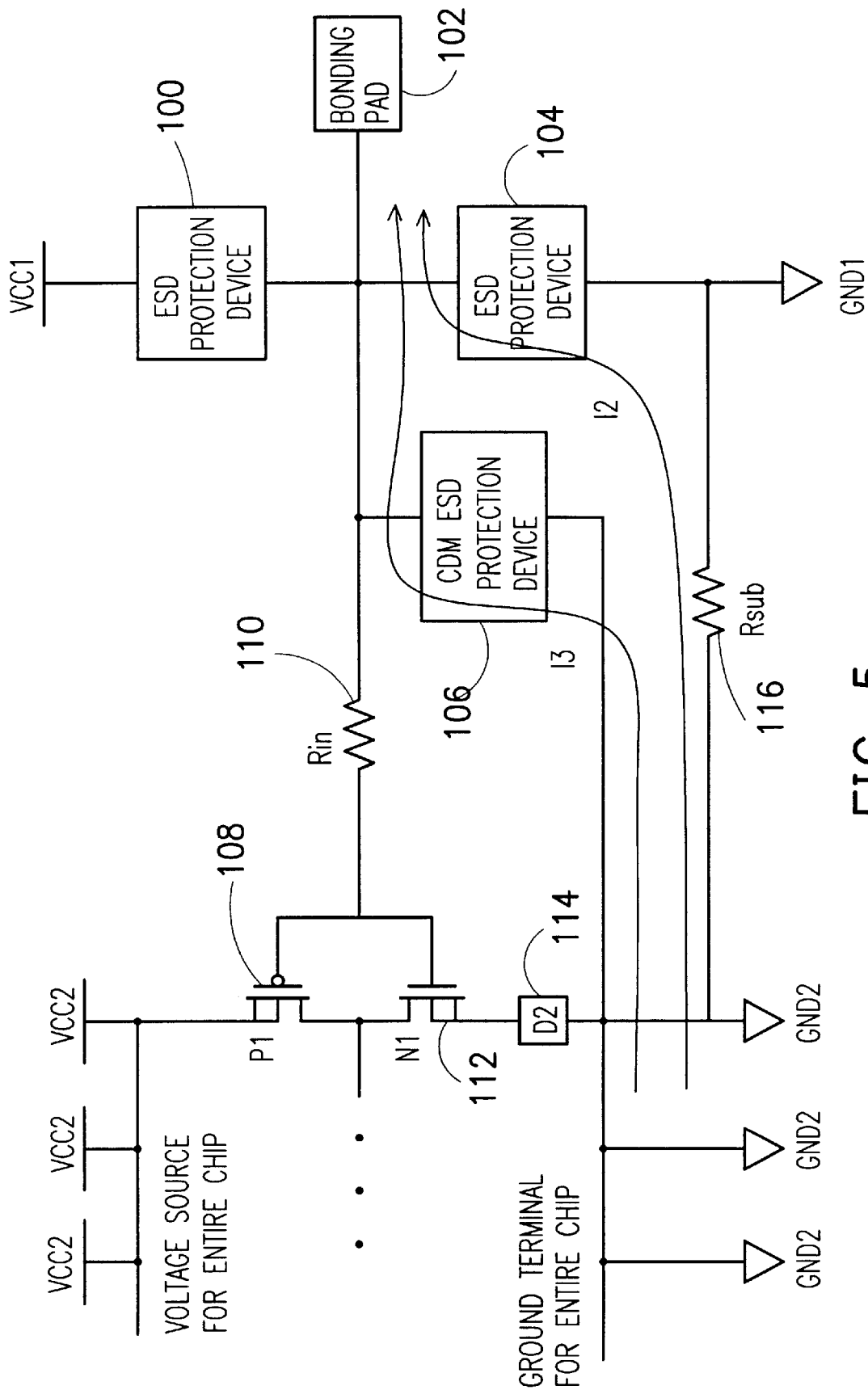
FIG. 5 is a block diagram showing an alternative electrostatic discharge protection circuit layout according to this invention.

FIG. 5 is a block diagram showing an alternative electrostatic discharge protection circuit layout according to this invention. In FIG. 2, if protection of the voltage source VCC2 against CDM ESD is unimportant, the charge flow prevention device D1 40 and the first CDM ESD protection device 36 can be deleted. The resulting configuration is shown in FIG. 5.

As shown in FIG. 5, the electrostatic discharge protection circuit includes a first ESD protection device 100, a second ESD protection device 104, a CDM ESD protection device 106, a PMOS transistor P1 108, an input resistor Rin 110, an NMOS transistor N1 112, a charge flow prevention device D2 114 and a substrate resistor Rsub 116. The first ESD protection device 100 is connected to a voltage source VCC2 and a bonding pad 102. The second ESD protection device 104 is connected to a ground terminal GND1 and the bonding pad 102. The CDM ESD protection device 106 is connected to a ground terminal GND2 and the bonding pad 104. The source terminal of the PMOS transistor 108 is connected to the voltage source VCC2. The substrate terminal and the source terminal of the PMOS transistor 108 are connected together. The input resistor Rin 110 is connected to the gate terminal of the PMOS transistor 108 and the bonding pad 102. The drain terminal of the NMOS transistor 112 is connected to the drain terminal of the PMOS transistor 108. The gate terminal of the NMOS transistor 112 is connected to the gate terminal of the PMOS transistor 108. The substrate terminal and the source terminal of the NMOS transistor 112 are connected together. The charge flow prevention device 114 is connected to the source terminal of the NMOS transistor 112 and the ground terminal GND2. The substrate resistor Rsub 116 is connected to the ground terminal GND1 and the ground terminal GND2. The substrate resistor Rsub 116 is an equivalent resistor of the substrate between the ground terminal GND1 and the ground terminal GND2.

When a CDM ESD of the integrated circuit device occurs, charges are channeled from the substrate to the bonding pad 102 via pathways I2 and I3. Pathway I2 starts out from a ground terminal GND2 via a substrate resistor Rsub 116 and an ESD protection device 104 to arrive at the bonding pad 102. Pathway I3 starts out from the ground terminal GND2 via the CDM ESD protection device 106 to arrive at the bonding pad 102.

The charge flow prevention device D2 114 prevents any abnormal charge current from flowing from the substrate of the integrated circuit device through the gate oxide layer of the NMOS transistor N1 112 and damaging the NMOS transistor 112. The second CDM ESD protection device 106 provides a discharging loop (via pathway I3 because pathway I2 has the substrate resistor Rsub 116 and hence conduction speed of the CDM ESD protection device 106 is faster than the ESD protection device 104). Hence, any abnormal charge current from the substrate of the integrated circuit device is channeled to the bonding pad 102 via the CDM ESD protection device 106 and the second ESD protection device 104. The layout of the CDM ESD protection device 106 within the integrated circuit device is capable of reducing electrical latch-up.

In conclusion, this invention provides an electrostatic discharge protection circuit layout having an additional CDM ESD protection device within the integrated circuit device. Hence, charges within the integrated circuit device can be channeled away via the discharging loop provided by the CDM ESD protection device and the ESD protection device. Without a discharging current flowing through the integrated circuit device, a destructive effect caused by CDM ESD on the integrated circuit is prevented. Furthermore, the layout of the CDM ESD protection device within the integrated circuit device is capable of reducing electrical latch-up.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection circuit layout for an integrated circuit device, comprising:
    a first ESD protection device coupled to a first voltage source and a bonding pad;
    a second ESD protection device coupled to a first ground terminal and the bonding pad;
    a first charge-device model (CDM) ESD protection device coupled to a second voltage source and the bonding pad;
    a second CDM ESD protection device coupled to a second ground terminal and the bonding pad;
    a first charge flow prevention device coupled to the second voltage source;
    a PMOS transistor, wherein a source terminal of the PMOS transistor is connected to the first charge flow prevention device, and a substrate terminal and the source terminal of the PMOS transistor are connected together;
    an input resistor coupled to a gate terminal of the PMOS transistor and the bonding pad;
    an NMOS transistor, wherein a drain terminal of the NMOS transistor is connected to a drain terminal of the PMOS transistor, a gate terminal of the NMOS transistor is connected to the gate terminal of the PMOS transistor, and a substrate terminal and a source terminal of the NMOS transistor are connected together;
    a second charge flow prevention device coupled to the source terminal of the NMOS transistor and the second ground terminal; and
    substrate resistor coupled to the first ground terminal and the second ground terminal;
    wherein the first charge flow prevention device prevents any abnormal charge current from flowing from the second voltage source through a gate oxide layer of the PMOS transistor and damaging the PMOS transistor, the first CDM ESD protection device provides a discharging loop so that any abnormal charge current from the second voltage source is channeled to the bonding pad via the first CDM ESD protection device, similarly, the second charge flow prevention device prevents any abnormal charge current from flowing from the substrate of the integrated circuit device through a gate oxide layer of the NMOS transistor and damaging the NMOS transistor, the second CDM ESD protection device provides a discharging loop so that any abnormal charge current from the substrate of the integrated circuit device is channeled to the bonding pad via the second CDM ESD protection device, and the first CDM ESD protection device and the second CDM ESD protection device within the integrated circuit device are positioned far away from the NMOS and PMOS transistor so that electrical latch-up is minimized.

2. The layout of claim 1, wherein the first ESD protection device and the second ESD protection device together constitute a protective circuit preventing any damage to the integrated circuit device through an electrostatic discharge via the bonding pad.

3. The layout of claim 1, wherein the substrate resistor equivalent in resistance to the substrate between the first ground terminal and the second ground terminal.

4. The layout of claim 1, wherein the first CDM ESD protection device includes a PMOS transistor.

5. The layout of claim 1, wherein the second CDM ESD protection device includes an NMOS transistor.

6. The layout of claim 1, wherein the first charge flow prevention device is a resistor, inductor or metal-oxide-semiconductor (MOS) field effect transistor.

7. The layout of claim 1, wherein the second charge flow prevention device is a resistor, inductor or metal-oxide-semiconductor (MOS) field effect transistor.

8. An electrostatic discharge (ESD) protection circuit layout for an integrated circuit device, comprising:
    a first ESD protection device coupled to a first voltage source and a bonding pad;
    a second ESD protection device coupled to a first ground terminal and the bonding pad;
    a charge-device model (CDM) ESD protection device coupled to a second ground terminal and the bonding pad;
    a PMOS transistor, wherein a source terminal of the PMOS transistor is connected to a second voltage source and a substrate terminal and the source terminal of the PMOS transistor are connected together;
    an input resistor coupled to a gate terminal of the PMOS transistor and the bonding pad;
    an NMOS transistor, wherein a drain terminal of the NMOS transistor is connected to a drain terminal of the PMOS transistor, a gate terminal of the NMOS transistor is connected to the gate terminal of the PMOS transistor and a substrate terminal and the source terminal of the NMOS transistor are connected together;
    a charge flow prevention device coupled to the source terminal of the NMOS transistor and the second ground terminal; and
    substrate resistor coupled to the first ground terminal and the second ground terminal;
    wherein the charge flow prevention device prevents any abnormal charge current from flowing from the substrate of the integrated circuit device through the gate oxide layer of the NMOS transistor and damaging the NMOS transistor, the CDM ESD protection device provides a discharging loop so that any abnormal charge current from the substrate of the integrated circuit device is channeled to the bonding pad via the CDM ESD protection device, and the CDM ESD protection device within the integrated circuit device is positioned in such a way that electrical latch-up is minimized.

9. The layout of claim 8, wherein the first ESD protection device and the second ESD protection device together comprise a protective circuit preventing any damage to the integrated circuit device through an electrostatic discharge via the bonding pad.

10. The layout of claim 8, wherein the substrate resistor is equivalent in resistance to the substrate between the first ground terminal and the second ground terminal.

11. The layout of claim 8, wherein the CDM ESD protection device includes an NMOS transistor.

12. The layout of claim 8, wherein the charge flow prevention device is a resistor, inductor or metal-oxide-semiconductor (MOS) field effect transistor.

* * * * *